(12) United States Patent
Loo

(10) Patent No.: US 7,709,954 B2
(45) Date of Patent: May 4, 2010

(54) REDISTRIBUTION LAYER FOR WAFER-LEVEL CHIP SCALE PACKAGE AND METHOD THEREFOR

(75) Inventor: Michael C. Loo, San Jose, CA (US)

(73) Assignee: NXP B.V., Eindhoven (NL)

( * ) Notice: Subject to any disclaimer, the term of this patent is extended or adjusted under 35 U.S.C. 154(b) by 52 days.

(21) Appl. No.: 12/090,686

(22) PCT Filed: Oct. 18, 2006

(86) PCT No.: PCT/IB2006/053840
§ 371 (c)(1),
(2), (4) Date: Nov. 18, 2008

(87) PCT Pub. No.: WO2007/046062
PCT Pub. Date: Apr. 26, 2007

(65) Prior Publication Data
US 2009/0072397 A1    Mar. 19, 2009

Related U.S. Application Data

(60) Provisional application No. 60/728,553, filed on Oct. 19, 2005.

(51) Int. Cl.
*H01L 23/48* (2006.01)
*H01L 21/44* (2006.01)
(52) U.S. Cl. ............... 257/738; 257/737; 257/734; 257/780; 257/E23.021; 257/E23.069; 438/612; 438/613; 438/614
(58) Field of Classification Search ............ 257/737, 257/738, E23.021, E23.023, E23.069, E21.476; 438/612–614
See application file for complete search history.

(56) References Cited

U.S. PATENT DOCUMENTS

| | | | |
|---|---|---|---|
| 6,111,317 A * | 8/2000 | Okada et al. | 257/737 |
| 6,452,270 B1 | 9/2002 | Huang | |
| 6,455,408 B1 * | 9/2002 | Hwang et al. | 438/613 |
| 6,521,970 B1 | 2/2003 | Takiar et al. | |
| 7,091,121 B2 * | 8/2006 | Horng | 438/612 |
| 2002/0096764 A1 | 7/2002 | Huang | |
| 2004/0209406 A1 | 10/2004 | Jan et al. | |
| 2005/0073049 A1 * | 4/2005 | Tsubosaki | 257/738 |

* cited by examiner

Primary Examiner—Jasmine J Clark
(74) Attorney, Agent, or Firm—Peter Zawilski

(57) ABSTRACT

In an example embodiment, there is a method for packaging an integrated circuit device (IC) having a circuit pattern (305) in a wafer-level chip-scale (WLCS) package (300). The method includes depositing a metal layer (5, 10, 15) on a first dielectric layer (315) and filling (20) in bond pad openings (310) and bump pad openings (330); the metal layer (360) has atop (340) and bottom (360) layer. In the metal layer (360), bond pad connections (310) and bump pad connections (330) are defined (25, 30) by removing the top layer of metal in areas other than at bond pad openings (310) and bump pad openings (330), and leaving the bottom layer (360) of metal in areas without bond pad or bump pad connections. In the bottom metal layer, connection traces between the bond pad and bump pad are defined (35, 40). A second organic dielectric layer (325) is deposited (45) on the silicon substrate (305), enveloping the circuit pattern. The second organic dielectric layer is removed (50) from the bump pad connections exposing the bump pads (330).

20 Claims, 3 Drawing Sheets

REDISTRIBUTION LAYER FOR WAFER-LEVEL CHIP SCALE PACKAGE AND METHOD THEREFOR

The invention relates to integrated circuit (IC) packaging. More particularly this invention relates to forming a wafer-level chip-scale package that includes a metal layer to redistribute very fine-pitched peripheral arrayed bond pads on an IC device to a much larger pitch area arrayed bump pads.

The electronics industry continues to rely upon advances in semiconductor technology to realize higher-function devices in more compact areas. For many applications realizing higher-functioning devices requires integrating a large number of electronic devices into a single silicon wafer. As the number of electronic devices per given area of the silicon wafer increases, the manufacturing process becomes more difficult.

Many varieties of semiconductor devices have been manufactured with various applications in numerous disciplines. Such silicon-based semiconductor devices often include metal-oxide-semiconductor field-effect transistors (MOSFET), such as p-channel MOS (PMOS), n-channel MOS (NMOS) and complementary MOS (CMOS) transistors, bipolar transistors, BiCMOS transistors. Such MOSFET devices include an insulating material between a conductive gate and silicon-like substrate; therefore, these devices are generally referred to as IGFETs (insulated-gate FET).

Each of these semiconductor devices generally includes a semiconductor substrate on which a number of active devices are formed. The particular structure of a given active device can vary between device types. For example, in MOS transistors, an active device generally includes source and drain regions and a gate electrode that modulates current between the source and drain regions.

Furthermore, such devices may be digital or analog devices produced in a number of wafer fabrication processes, for example, CMOS, BiCMOS, Bipolar, etc. The substrates may be silicon, gallium arsenide (GaAs) or other substrate suitable for building microelectronic circuits thereon.

After undergoing the process of fabrication, the silicon wafer has a predetermined number of devices. These devices are tested. Good devices are collected and packaged.

The packaging of complex IC devices is increasingly playing a role in its ultimate performance. Of particular significance is the wafer level chip scale package (WLCSP). This package permits the IC device to be attached face-down to a printed circuit board (PCB), with the IC device's pads connecting the printed circuit board's pads through individual solder balls. A principal benefit of WLCSP is that IC-to-PCB inductance is minimized. Other benefits include reduction in package size, reduction in cost, and manufacturing cycle time and enhanced thermal conduction characteristics. The benefits of WLCSP find application in portable electronic devices such as mobile telephones. An example of wafer-level chip-scale packaging may be found in U.S. Pat. No. 6,452,270 B1 issued on Sep. 17, 2002, of Huang and is incorporated by reference in its entirety.

For the wafer level chip scale package, a metal layer is applied to the top of the silicon substrate to connect from a smaller pitch peripheral bond pad to a larger pitch bump pad. In the fabrication, an organic dielectric material is deposited on the silicon substrate surface. The organic dielectric may be benzocyclobutene (BCB), epoxy, or polyimide, etc. The coated silicon substrate surface is masked to define the bond pad area and bump pad area. The dielectric material on the bond pad and bump pad is etched away.

Multiple metal layers of different metals and alloys, such as Al, NiV, Cu, Ti, NiV, and Cu, are deposited on the surfaces of the exposed bond pad, bump pad, and the dielectric material surfaces. In an example process, aluminum may be sputtered onto the silicon substrate, followed by a sputtering of layers of nickel-vanadium, followed by copper, titanium, another layer of nickel vanadium, and finished with a layer of copper.

These multiple metal layers have properties, that a single metal or alloy does not have, such as adhesion to organic dielectrics, enhanced conductivity, resilience to mechanical stress, resistance to diffusion of contaminants, etc. Aluminum provides reliable adhesion to the organic dielectric, but is susceptible to diffusion contamination; nickel-vanadium provides a barrier to contamination; copper provides superior electrical conductivity. Titanium provides an additional barrier and hardness to mechanical stresses. The additional layers of nickel-vanadium and copper provide provides additional contamination barriers and electrical conductivity. These multiple layers form a laminate that increase the reliability of the packaging. Thus, there is a metal layer composite of Al/NiV/Cu/Ti/NiV/Cu.

In another masking, photo resist is only applied to the solder bump pad so that the NiV/Cu will be etched away in regions other than the bump pad, leaving an Al/NiV/Cu/Ti layer. The NiV/Cu in this case provides the wetting surface for solder bump. After a first etching, photo resist is again applied to etch out the remaining Al/NiV/Cu/Ti in areas other than a defined metal trace connecting the bump pad to the bond pad. The bump pad is masked, as well. Another layer of organic dielectric is deposited on the metal layer of Al/NiV/Cu/Ti. The dielectric material at the bump pad location is etch away so a solder bump can be deposited on the top of the bump pad. The metal layer Al/NiV/Cu/Ti has the additional NiV/Cu layer thereon.

Refer to FIG. 1. Formed by the afore-mentioned process, a silicon substrate packaged in a WLCSP 100. Upon the silicon substrate 105 a bond pad 110 is surrounded by organic dielectric 115. The bond pad 110 is coupled via a metal trace 120 (of metal layer Al/NiV/Cu/Ti) to a bump region 125 (defined in the organic dielectric 115). At the bump region 125 there is a composite metal layer 120 of Al/NiV/Cu/Ti and the additional NiV/Cu layer 135. A second layer of organic dielectric 130 covers areas on the silicon substrate 105 is areas other than regions 125 receiving a solder bump 145. Metal layer 120 at the bond pad 110 has step coverage "A" owing to the sloping metal.

Refer to FIG. 2. On a silicon substrate 205, there is a dielectric layer 215. During the etching process of removing the NiV/Cu layer at locations other than the bump location, Ti is used as a barrier to prevent the Al/NiV/Cu under the Ti layer from etching away. However, the Ti layer is thin, about 0.1 µm thick. In areas with step coverage such as the bond pad area "A" connecting with the metal trace 235, the Ti may not fully cover the step resulting in etching Al/NiV/Cu step coverage area 210. Such undesirable etching may cause an open connection between the bond pad and metal trace or create a thinned connection trace. Such a thinned trace may reduce reliability of the packaged IC device.

There is exists a need for method to package IC devices in a wafer-level chip-scale package that prevents the undesirable etching in regions having step coverage thereby increasing device reliability and electrical yield.

In an example embodiment, there is a method for preparing an integrated circuit device (IC) having a circuit pattern on a silicon substrate, the circuit pattern having bond pads, for packaging in a wafer-level chip-scale (WLCS) package. The method comprises depositing a first organic dielectric layer on the silicon substrate, and covering the circuit pattern of the IC device. Above the bond pads of the circuit pattern and bump pad openings at a predetermined distance from the bond pad openings in the first organic dielectric layer bond pad openings are defined. A metal layer is deposited on the first dielectric layer and fills the bond pad openings and bump pad openings, the metal layer has a top layer of metal and a bottom layer of metal. Bond pad connections and bump pads are defined by removing the top layer of metal in areas other than the bond pad openings and bump pad openings, and leaving the bottom layer of metal in areas not having bond pad or bump pad connections. Connection traces are defined from the bond pad connections to the bump pad connections, in the bottom metal layer. A second organic dielectric layer is deposited on the silicon substrate, enveloping the circuit pattern. The second dielectric layer is removed from the bump pad connections and exposing the bump pad connections. A feature of this embodiment further includes defining the bond pad openings and bump pad openings by applying a photo resist to mask regions of the first organic dielectric in regions other than areas defined as the bond pad openings and bump pad openings and etching the areas defined as the bond pad openings and bump pad openings. An additional feature of this embodiment further includes, defining bond pad connections and bump pad connections by applying a photo resist to mask the top layer of metal over the bond pad openings and bump pad openings, the photo resist serving as an etch barrier to a top metal layer etch. In yet another additional feature of this embodiment, further includes, defining connection traces by applying a photo resist to mask the bond pad and bump pad connections and mask those areas of bottom layer metal forming the connection traces between the bond pad and bump pad.

In another embodiment, there is a method for preparing an integrated circuit device (IC) having a circuit pattern on a silicon substrate, the circuit pattern having bond pads, for packaging in a wafer-level chip-scale (WLCS) package. The method comprises depositing a first organic dielectric layer on the silicon substrate, covering the circuit pattern of the IC device. The first organic dielectric layer is selected from the following: benzocyclobutene, epoxy, polyimide. Bond pad openings are defined above the bond pads of the circuit pattern and bump pad openings at a predetermined distance from the bond pad openings in the first organic dielectric layer, wherein defining the bond pad openings and bump pad openings further comprises, applying a photo resist to mask regions of the first organic dielectric in regions other than areas defined as the bond pad openings and bump pad openings. Areas defined as the bond pad openings and bump pad openings are etched. A metal layer is deposited on the first dielectric layer and filling the bond pad openings and bump pad openings; the metal layer has a top layer of metal and a bottom layer of metal; the top metal layer has two sub-layers including of, NiV and Cu or Cr and W, and the bottom metal layer has four sub-layers including of Al, NiV, Cu, Ti. Bond pad connections and bump pad connections are defined by removing the top layer of metal in areas other than the bond pad openings and bump pad openings, and leaving the bottom layer of metal in areas not having bond pad or bump pad connections, and wherein defining bond pad connections and bump pad connections further comprises, applying a photo resist to mask the top layer of metal over the bond pad openings and bump pad openings, the photo resist serving as an etch barrier to a top metal layer etch. Connection traces from the bond pad connections to the bump pad connections, in the bottom metal layer are defined; and defining the connection traces further comprises, applying a photo resist to mask the bond pad and bump pad connections and mask those areas of bottom layer metal forming the connection traces between the bond pad and bump pad. A second organic dielectric layer is deposited on the silicon substrate, enveloping the circuit pattern, the second organic dielectric layer is selected from the following: benzocyclobutene, epoxy, and polyimide. The second organic dielectric layer is removed from the bump pad connections and the bump pad connections are exposed. Solder balls are applied to the exposed bump pad connections.

In yet another embodiment, there is a wafer-level chip-scale (WLCS) package for packaging an integrated circuit device (IC), the IC having a circuit pattern on a silicon substrate, the circuit pattern having bond pads. The WLCS package comprises a first dielectric layer covering the circuit pattern, wherein bond pad openings are defined in the first dielectric layer over the bond pads and bump pad openings, bump pad openings being at predetermined distances from corresponding bond pad openings. There is a metal redistribution layer deposited on the first dielectric layer in the bond pad openings and bump pad openings, the metal redistribution layer having mutually isolated connection traces, electrically coupling bond pads with corresponding bump pad connections defined by the metal redistribution layer in the bump pad openings; the metal redistribution layer includes a top metal layer and a bottom metal layer, wherein the connection traces include only the bottom metal layer. A second dielectric layer covers the metal redistribution layer except at bump pad connections. Solder bumps are attached to the bump pad connections. A feature of this embodiment further includes, the top metal layer having one or more metal sub-layers; and the bottom metal having one or more metal sub-layers.

The above summary of the present invention is not intended to represent each disclosed embodiment, or every aspect, of the present invention. Other aspects and example embodiments are provided in the figures and the detailed description that follows.

The invention may be more completely understood in consideration of the following detailed description of various embodiments of the invention in connection with the accompanying drawings, in which.

Figure 1:
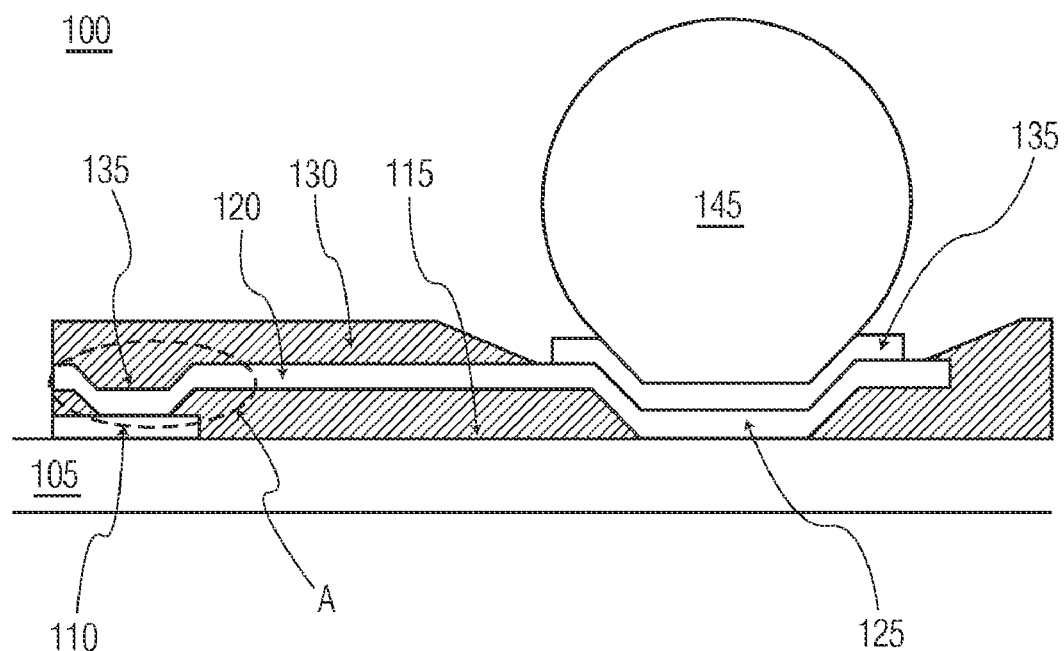
FIG. 1 (Prior Art) is a side view of a bond pad/bump pad configuration used in a wafer-level chip-scale (WLCS) package.
Figure 2:
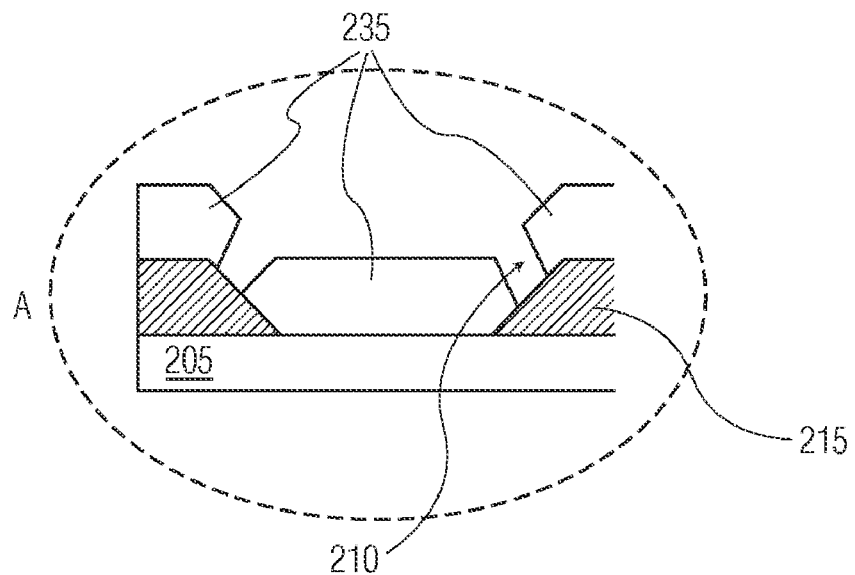
FIG. 2 (Prior Art) is a side view of over-etch in metal layers having thin step coverage near the bond pad.
Figure 3A:
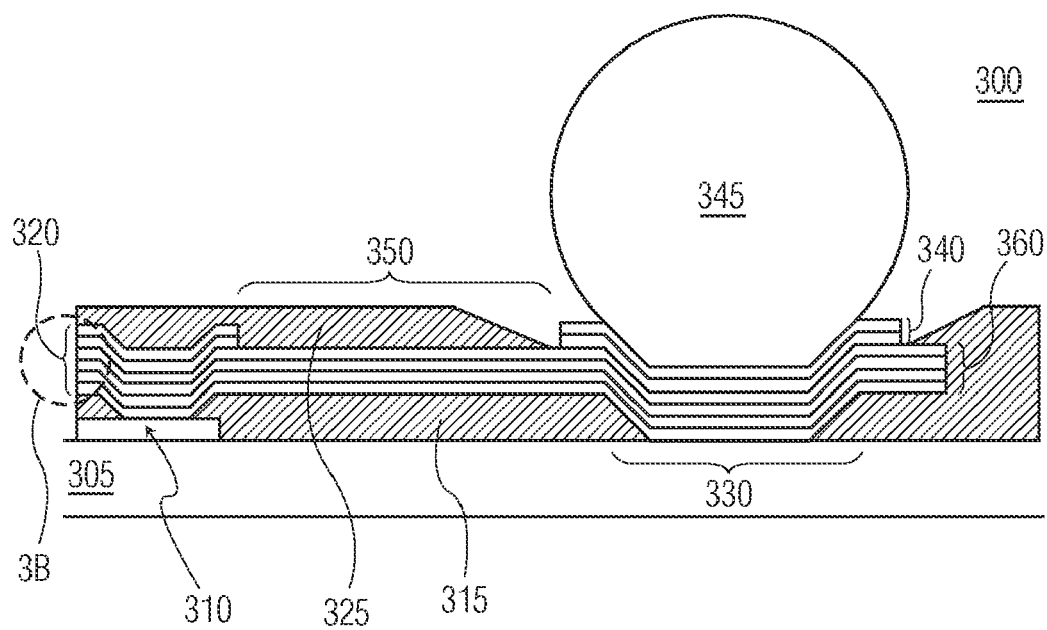
Figure 3B:
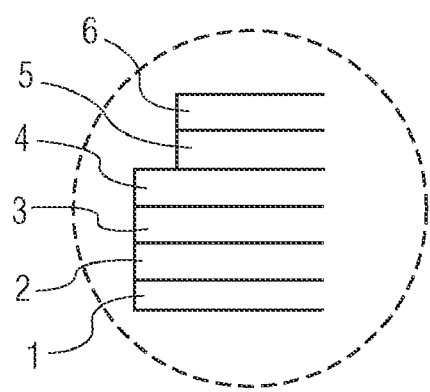
Figure 4:
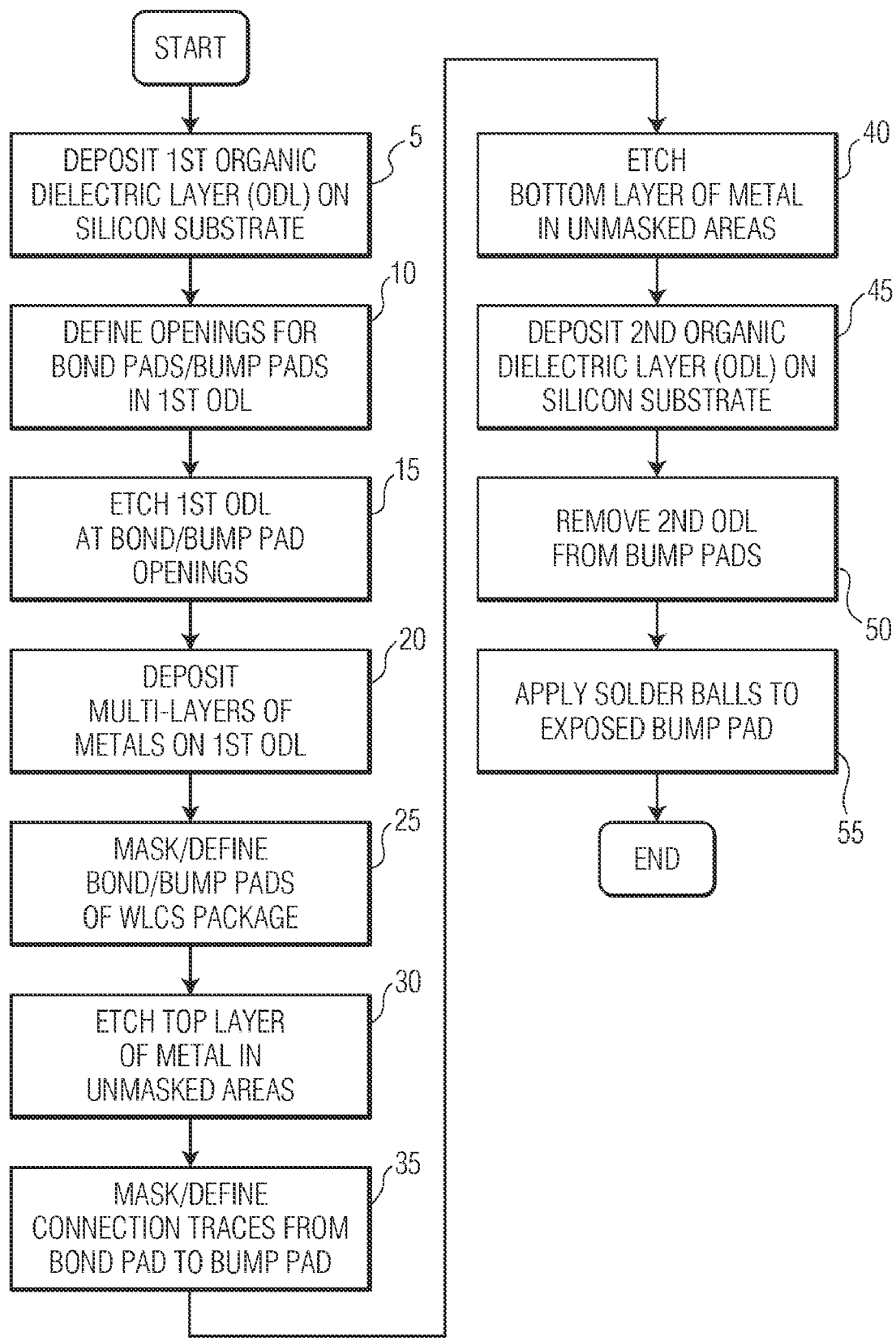

FIG. 3 is a side view of a bond pad/bump pad structure fabricated in accordance with an embodiment of the present invention; and FIG. 4 is a flowchart of an example process in fabricating bond pad/bump structure in accordance with an embodiment of the present invention While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

The present invention has been found to be useful preventing the etching at the bond pad the thin Ti barrier layer and the Al/NiV/Cu layers underneath (the six-layer Al/NiV/Cu/Ti/NiV/Cu metal) resulting in open connections in the metal traces between the bond pads and bump pads of an IC device during etching of the top level NiV/Cu. Photo resist is used to provide an additional barrier to the Ti layer so that the likelihood of etching thorough the Ti layer and the lower layers of Al/Ni/Cu is minimized during the etching of the NiV/Cu at the bump pads. The resulting structure has a top metal layer of Ni/Cu and a bottom metal layer Al/NiV/Cu/Ti at both the bond pads and bump pads. The use of the additional barrier of photo resist is not necessarily limited to the six-layer metal system, depicted but may be applied to metal systems of differing numbers of layers.

Refer to FIG. 3. In an example embodiment, a structure 300 of a bond pad 310 connected to a bump pad 330 built according to an embodiment of the present invention, the silicon substrate 305 has an IC device pattern thereon. A first organic dielectric layer 315 is provided over the silicon substrate 305. Areas in the first organic dielectric layer 315 define a bump pad region 330 and a bond pad region in the location of the bond pad 310. Multiple layers of metal 320 have been deposited. For example, metal layers 1 through 6, respectively include, but are not limited to, Al/NiV/Cu/Ti/NiV/Cu. However, in a connection trace 350 between the bond pad 310 and the bump pad 330, only metal layers 1 through 4 (a bottom metal layer 360) are present over the first organic dielectric layer 315. Metal layers 5 and 6 are (a top metal layer 340 of NiV/Cu). Bottom metal layer 360 (Al/NiV/Cu/Ti) connects the bond pad 310 to the bump pad 330. A second organic dielectric layer 325 provides passivation to the connection trace 350 and to the metal 320 at the bond pad 310. Solder bump 345 is attached to the bump pad 330 onto the metal layer 6 of the top metal layer 340. In another example, the top metal layer 340 may include chromium (Cr) and Tungsten (W). The particular order of the layers is governed by the specific process requirements for a given package.

In another embodiment according to the present invention, there is a silicon substrate having an integrated circuit pattern that is packaged in a WLCS package. The IC pattern has bond pads to provide electrical connection from the circuit pattern to the environment. The bond pads are, for example, Al/Si/Cu or other suitable metal.

Refer to FIG. 4. Upon the surface of the integrated circuit pattern a first organic dielectric layer is deposited thereon 5. Through photo-lithography, openings are defined in the first organic dielectric layer at the bond pads and in regions where bump pads are placed 10. The organic dielectric layer deposited on the bond pad areas and in regions of bump pads, is etched away 15. In one embodiment, a composite metal layer in which layers of metals and alloys including Al/NiV/Cu/Ti/NiV/Cu are deposited on the exposed surfaces of the bond pad, bump pad and on the organic dielectric layer 20. The layers of metal are deposited one metal layer at a time. The metal layers may be sputtered on or be deposited with chemical vapor deposition. In an example package, metal layer thicknesses are 1.0 µm, 0.3 µm, 0.8 µm, 0.1 µm, 0.3 µm, and 0.8 µm for Al, NiV, Cu, Ti, NiV, and Cu, respectively.

Photo resist is applied to mask the bond pads and bump pads 25. In a first etch the NiV/Cu is removed as a top layer of metal 30 from the unmasked areas organic dielectric layer. In other packages, the top layer metal may also include chromium and tungsten. In the bond pads and bump pads all of the composite metal layer remains. To define connection traces coupling a group of bump pads to their corresponding bond pads, photo resist is applied again 35 and unmasked areas of Al/NI/Cu/Ti are etched away as a bottom layer of metal 40. On the silicon substrate, a second organic dielectric layer is deposited 45 on the bonding pads, bump pads, and connection traces. To expose the bump pad for subsequent electrical connection, the bonding pads and connection traces are masked. The unmasked bump pads are exposed, so that the second organic dielectric layer may be removed from the bump pads 50. Solder bumps are applied to the exposed bump pads 55. Although the present example discusses a single die, typically, multiple IC devices on a wafer are packaged. Each device is then electrically tested. Failing IC devices are culled out. Passing IC devices may then be used in their given application. The number of bump pads in a WLCS package is determined by the number of bond pad on the IC device and the overall IC device area. Typically, the bump pads may be arrayed. For example, 2×2, 3×3, 4×4, . . . , N×N.

Since the metal layer at the bond pads and bump pads is protected by applying photo resist before defining the connection traces, the over etching of the step coverage at the bond pads is prevented. Also the top metal layer and bottom metal layer present in the bond pad enhances its reliability, and ultimately the packaged IC device.

While the present invention has been described with reference to several particular example embodiments, those skilled in the art will recognize that many changes may be made thereto without departing from the spirit and scope of the present invention, which is set forth in the following claims.

What is claimed is:

1. A method for preparing an integrated circuit device having a circuit pattern, on a silicon substrate, the circuit pattern having bond pads, for packaging in a wafer-level chip-scale (WLCS) package, the method comprising:
   depositing a first organic dielectric layer on the silicon substrate, covering the circuit pattern of the IC device;
   defining bond pad openings above the bond pads of the circuit pattern and bump pad openings at a predetermined distance from the bond pad openings in the first organic dielectric layer;
   depositing a metal layer on the first dielectric layer and filling the bond pad openings and bump pad openings, the metal layer having a top layer of metal and a bottom layer of metal;
   defining bond pad connections and bump pad connections by removing the top layer of metal in areas other than the bond pad openings and bump pad openings, and leaving the bottom layer of metal in areas not having bond pad or bump pad connections;
   defining connection traces from the bond pad connections to the bump pad connections, in the bottom metal layer;
   depositing a second organic dielectric layer on the silicon substrate, enveloping the circuit pattern; and
   removing the second organic dielectric layer from the bump pad connections and exposing the bump pad connections.

2. The method as recited in claim 1, wherein defining the bond pad openings and bump pad openings further includes,
   applying a photo resist to mask regions of the first organic dielectric in regions other than areas defined as the bond pad openings and bump pad openings,
   etching the areas defined as the bond pad openings and bump pad openings.

3. The method as recited in claim 1, wherein defining bond pad connections and bump pad connections further includes, applying a photo resist to mask the top layer of metal over the bond pad openings and bump pad openings, the photo resist serving as an etch barrier to a top metal layer etch.

4. The method as recited in claim 3, wherein defining connection traces further comprises, applying a photo resist to mask the bond pad and bump pad connections and mask those areas of bottom metal layer forming the connection traces between the bond pad and bump pad.

5. The method as recited in claim 4, further including, applying solder balls to the exposed bump pad connections.

6. The method as recited in claim 5, wherein the metal layer further includes, deposited multiple sub-layers of metal.

7. The method as recited in claim 2, wherein, the top metal layer includes one or more metal sub-layers; and the bottom metal layer includes one or more metal sub-layers.

8. The method as recited in claim 7, wherein the top metal layer includes metals selected from the following: Ni, V, Cu, NiV, Cr, and W.

9. The method as recited in claim 7, wherein the bottom metal layer includes metals selected from the following: Al, Ni, V, Cu, Ti, and NiV.

10. The method as recited in claim 8 wherein, the top metal layer includes two sub-layers consisting of, NiV and Cu or Cr and W; the bottom metal layer includes four sub-layers consisting of Al, NiV, Cu, and Ti.

11. The method as recited in claim 1, wherein the first organic and second organic dielectric layers are selected from the following: benzocyclobutene, epoxy, polyimide.

12. The method as recited in claim 4, wherein the first organic and second organic dielectric layers are selected from the following: benzocyclobutene, epoxy, polyimide.

13. A method for preparing an integrated circuit device (IC) having a circuit pattern, on a silicon substrate, the circuit pattern having bond pads, for packaging in a wafer-level chip-scale (WLCS) package, the method comprising:
depositing a first organic dielectric layer on the silicon substrate, covering the circuit pattern of the IC device, the first organic dielectric layer selected from the following: benzocyclobutene, epoxy, polyimide;
defining bond pad openings above the bond pads of the circuit pattern and bump pad openings at a predetermined distance from the bond pad openings in the first organic dielectric layer,
wherein defining the bond pad openings and bump pad openings further comprises,
applying a photo resist to mask regions of the first organic dielectric in regions other than areas defined as the bond pad openings and bump pad openings;
etching the areas defined as the bond pad openings and bump pad openings;
depositing a metal layer on the first dielectric layer and filling the bond pad openings and bump pad openings, the metal layer having a top layer of metal and a bottom layer of metal, the top metal layer having two sub-layers including one of, NiV and Cu or Cr and W, the bottom metal layer having four sub-layers including Al, NiV, Cu, and Ti;
defining bond pad connections and bump pad connections by removing the top layer of metal in areas other than the bond pad openings and bump pad openings, and leaving the bottom layer of metal in areas not having bond pad or bump pad connections,
wherein defining bond pad connections and bump pad connections further comprises,
applying a photo resist to mask the top layer of metal over the bond pad openings and bump pad openings, the photo resist serving as an etch barrier to a top metal layer etch;
defining connection traces from the bond pad connections to the bump pad connections, in the bottom metal layer,
wherein defining connection traces further comprises,
applying a photo resist to mask the bond pad and bump pad connections and mask those areas of the bottom metal layer forming the connection traces between the bond pad and bump pad,
depositing a second organic dielectric layer on the silicon substrate,
enveloping the circuit pattern, the second organic dielectric layer selected from the following: benzocyclobutene, epoxy, polyimide; removing the second organic dielectric layer from the bump pad connections and exposing the bump pad connections; and applying solder balls to the exposed bump pad connections.

14. A wafer-level chip-scale(WLCS) package for packaging an integrated circuit device(IC), the IC having a circuit pattern on a silicon substrate, the circuit pattern having bond pads, the WLCS package comprising:
a first dielectric layer covering the circuit pattern, wherein bond pad openings are defined in the first dielectric layer over the bond pads and bump pad openings, bump pad openings are defined and located at predetermined distances from corresponding bond pad openings;
a metal redistribution layer deposited on the first dielectric layer in the bond pad openings and bump pad openings, the metal redistribution layer having mutually isolated connection traces, electrically coupling bond pads with corresponding bump pad connections defined by the metal redistribution layer in the bump pad openings, the metal redistribution layer including a top metal layer and a bottom metal layer, wherein the connection traces include only the bottom metal layer;
a second dielectric layer covering the metal redistribution layer except at bump pad connections; and
solder bumps attached to the bump pad connections.

15. The WLCS package as recited in claim 14, wherein the top metal layer includes one or more metal sub-layers; and the bottom metal includes one or more metal sub-layers.

16. The WLCS package as recited in claim 15, wherein the one or more metal sub-layers of the top metal layer includes metals selected from the following: Ni, V, Cu, NiV, Cr, and W; and the one or more metal sub-layers of the bottom metal layer includes metals selected from the following: Al, Ni, V, Cu, Ti, and NiV.

17. The WLCS package as recited in claim 16, wherein the first and second dielectric layer includes materials selected from the following: benzocyclobutene, epoxy, polyimide.

18. The WLCS package as recited in claim 17, wherein the bottom metal layer consists of four metal sub-layers of Al, Ni, NiV, and Ti; and the top metal layer consists of two metal sub-layers of NiV and Cu or Cr and W.

19. The WLCS package as recited in claim 17, wherein the bottom metal layer consists of four metal sub-layers deposited in order of, Al, Ni, NiV, Ti; and the top metal layer consists of two metal sub-layers deposited in order of, NiV, Cu.

20. The WLCS package as recited in claim 17, wherein the bottom metal layer consists of four metal sub-layers deposited in order of, Al, Ni, NiV, Ti; and the top metal layer consists of two metal sub-layers deposited in order of, W, Cr.

* * * * *